United States Patent
Tsukikawa et al.

(10) Patent No.: US 6,903,961 B2
(45) Date of Patent: Jun. 7, 2005

(54) SEMICONDUCTOR MEMORY DEVICE HAVING TWIN-CELL UNITS

(75) Inventors: Yasuhiko Tsukikawa, Hyogo (JP); Takashi Ito, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/606,240

(22) Filed: Jun. 26, 2003

(65) Prior Publication Data

US 2004/0141361 A1 Jul. 22, 2004

(30) Foreign Application Priority Data

Jan. 17, 2003 (JP) ........................................ 2003-009733

(51) Int. Cl.[7] .............................................. G11C 11/24
(52) U.S. Cl. ..................................... 365/149; 365/102
(58) Field of Search ................................ 365/149, 102, 365/104, 210, 139, 190

(56) References Cited

U.S. PATENT DOCUMENTS

| | | | | |
|---|---|---|---|---|
| 5,363,327 A | * | 11/1994 | Henkles et al. | .............. 365/149 |
| 5,381,379 A | * | 1/1995 | Fukumoto | ................. 365/238.5 |
| 5,724,293 A | * | 3/1998 | Tomishima et al. | .......... 365/207 |
| 6,573,613 B2 | * | 6/2003 | Arimoto et al. | ............. 257/296 |

FOREIGN PATENT DOCUMENTS

| | | |
|---|---|---|
| JP | 04-44692 | 2/1992 |
| JP | 07-130172 | 5/1995 |

* cited by examiner

*Primary Examiner*—Thong Q. Le
(74) *Attorney, Agent, or Firm*—McDermott Will & Emery LLP

(57) ABSTRACT

Each of twin-cell units each formed of two DRAM cells has a cell plate electrically isolated from the cell plates in the other twin-cell units. Thereby, voltages on two storage nodes storing mutually complementary data in the same twin-cell unit change similarly to each other owing to capacitive coupling.

16 Claims, 17 Drawing Sheets

SEMICONDUCTOR MEMORY DEVICE HAVING TWIN-CELL UNITS

BACKGROUND OF THE INVENTION

1. Field of the Invention

The present invention relates to a semiconductor memory device, and particularly to a twin-cell DRAM (Dynamic Random Access Memory) storing one bit of data by two memory cells. More particularly, the invention relates to a memory cell structure of a DRAM, which is formed of twin-cell structures and has improved refresh characteristics.

2. Description of the Background Art

For example, Japanese Patent Laying-Open No. 7-130172, which will be referred to as a "prior art 1" hereinafter, has disclosed a twin-cell DRAM storing one bit of data by two memory cells for suppressing lowering of an operation margin such as lowering of a read voltage, which may occur in memory cells having a reduced layout area.

In the prior art 1, a layout of memory cells is similar to that of general DRAM cells storing one bit of data by one cell (i.e., in a single mode). Two word lines are simultaneously selected, and data of memory cell is read onto each bit line of bit line pair. In this twin-cell DRAM storing complementary data in the two memory cells, it is possible to double a voltage difference between the bit lines, as compared with the DRAM of the one-bit/one-cell type (i.e., the single cell type), so that the sense operation can be stable.

FIG. 17 shows an array structure of a conventional twin-cell DRAM in the prior art.

In the twin-cell DRAM, as shown in FIG. 17, a twin-cell unit 101, which is a storage unit for one bit data, is formed of two DRAM cells 100 connected to complementary bit lines BL and /BL forming a bit line pair BLP, respectively. The two word lines related to DRAM cells 100, which form the same twin-cell unit, form a word line pair WLP. For example, word lines WL and WL# in FIG. 17 form a word line pair WLP, and are commonly (i.e., simultaneously) selected.

DRAM cell 100 has a select (access) transistor 110 connected between corresponding bit line BL (or /BL) and a storage node 140 as well as a capacitor 120 connected between a cell plate 130 and storage node 140. Access transistor 110 and bit line BL (or /BL) are electrically connected via a bit line contact 160, and storage node 140 and access transistor 110 are electrically connected via a storage node contact 170.

As already described, DRAM cell 100 stores data in the form of electric charges accumulated on storage node 140 by capacitor 120. Cell plate 130 is provided commonly to the whole memory cell array, and is fixed at a predetermined cell plate voltage VCP.

A sense amplifier 105 amplifies a voltage difference between complementary bit lines BL and /BL forming the bit line pair to that between a power supply voltage Vdd and a ground voltage GND. Two DRAM cells 100 forming the same twin-cell unit 101 bear data at complementary levels (i.e., H- and L-levels), respectively.

FIG. 18 illustrates a behavior of voltages on the bit line pair, which is exhibited when power supply voltage Vdd is used as a precharge voltage of bit lines.

Referring to FIG. 18, each of the complementary bit lines is precharged to power supply voltage Vdd before selection of the word line at a time T1. When word line WL thus precharged is selected and activated to attain H-level, a voltage change ΔV in the negative direction corresponding to the L-level data necessarily occurs on one of the complementary bit lines. Through an amplifying operation of the sense amplifier between times T2 and T3, a voltage difference ranging from power supply voltage Vdd to ground voltage GND can be generated between the complementary bit lines forming bit line pair BLP.

As illustrated in FIG. 19, therefore, a refresh time tREF2 in the twin-cell DRAM is defined by a time, which elapses before the voltage on the storage node storing H-level data (i.e., the storage node set to power supply voltage Vdd) lowers to ground voltage GND corresponding to the voltage on the storage node storing L-level data.

In the DRAM cell, since a capacitor is used as a data record medium, the stored data may disappear due to a leak current. For preventing this disappearance of data, as described before, the DRAM internally reads and rewrites the memory cell data to perform a refresh operation for restoring original data.

As the memory cell is miniaturized to a higher extent, an electrostatic capacity value of the memory cell capacitor decreases, and thereby the refreshing must be performed at shorter intervals. In general, the DRAM cannot be accessed during the refresh operation. Therefore, the shorter refresh interval lowers the processing efficiency of the system. Further, a power consumption for the refreshing increases.

In the general twin-cell DRAM disclosed in the prior art 1 or the like, the refresh interval can be longer than that in the single-cell DRAM. In recent years, however, semiconductor devices have been employed in an increasing number of portable devices primarily powered by batteries, and therefore demands for reduction of the size and power consumption of the semiconductor memory devices have been increasing. Thus, the twin-cell DRAM is likewise required to increase further the refresh period, and thus to improve further the refresh characteristics.

Further, in the twin-cell DRAM, since one bit of data is stored in two memory cells, a cell unit storing one bit of data necessarily occupies a large area. If two layouts of the conventional DRAM cells are used for achieving the twin-cell unit storing one bit of the data, the layout area of the twin-cell unit forming the data storage unit increases double. In this case, the storage capacity decreases to half the capacity of the single-cell DRAM of the one-bit/one-cell type, and it becomes difficult to achieve a twin-cell DRAM of a large storage capacity.

SUMMARY OF THE INVENTION

An object of the invention is to provide a semiconductor memory device (DRAM) of a twin-cell type having improved refresh characteristics. Another object of the invention is to provide a semiconductor memory device (DRAM), which can provide twin-cell units in a small layout area.

According to the invention, a semiconductor memory device includes a plurality of memory cells arranged in rows and columns, and the plurality of memory cells are divided into a plurality of storage units each formed of the two memory cells bearing complementary data. The semiconductor memory device further includes a plurality of bit lines forming pairs each including the two bit lines and arranged corresponding to the columns of the memory cells, respectively; a plurality of word lines arranged corresponding to the rows of the memory cells, respectively, and extending in a direction crossing the plurality of bit lines; and a plurality of cell plates provided corresponding the storage units, respectively, and each isolated at least electrically from the others. Each of the plurality of memory cells includes a select transistor connected between the corresponding bit line and a storage node, and being turned on or off in accordance with a voltage on the corresponding word line, and a capacitor connected between the storage node and the corresponding cell plate.

According to another aspect of the invention, a semiconductor memory device includes a plurality of memory cells arranged in rows and columns, and the plurality of memory cells are divided into a plurality of storage units each formed of the two memory cells bearing complementary data. The semiconductor memory device further includes a plurality of bit lines forming pairs each including the two bit lines and arranged corresponding to the columns of the memory cells, respectively; a plurality of word lines arranged corresponding to the rows of the memory cells, respectively, and extending in a direction crossing the plurality of bit lines; and a plurality of cell plates provided corresponding to predetermined sections of the plurality of storage units, respectively, and each isolated at least electrically from the others. Each of the plurality of memory cells includes a select transistor connected between the corresponding bit line and a storage node, and being turned on or off in accordance with a voltage on the corresponding word line, and a capacitor connected between the storage node and the corresponding cell plate.

According to still another aspect of the invention, a semiconductor memory device includes a plurality of memory cells arranged in rows and columns, and the plurality of memory cells are divided into a plurality of storage units each formed of the two memory cells bearing complementary data. The semiconductor memory device further includes a plurality of bit lines arranged corresponding to the columns of the memory cells, respectively; a plurality of word lines arranged corresponding to the rows of the memory cells, respectively, and extending in a direction crossing the plurality of bit lines; and a plurality of cell plates provided corresponding to the storage units, respectively, and each isolated at least electrically from the others. One of the two memory cells forming each of the storage unit includes a select transistor connected between one of the paired two bit lines and a storage node, and being turned on or off in accordance with a voltage on the corresponding word line, and a capacitor connected between the storage node and the corresponding cell plate. The other of the two memory cells forming the storage unit includes a select transistor connected between the other of the paired two bit lines and the cell plate without interposing a capacitor, and being turned on or off in accordance with the voltage on the corresponding word line.

Accordingly, the invention can achieve the following major advantage. Since the cell plate corresponding to each storage unit (twin-cell unit) is isolated at least electrically from the others, the voltages on the storage nodes, which are included in the same twin-cell unit and stores the complementary data, respectively, change similarly to each other owing to capacitive coupling. Therefore, the refresh time can be increases. Further, even when a short circuit occurs between the storage node and another node, a certain voltage difference is kept between the storage nodes included in the same twin-cell unit. Therefore, production of faulty memory cells due to the short circuit can be avoided. Consequently, it is possible to improve refresh characteristics and manufacturing yield of the semiconductor memory devices.

Further, a capacitor may be eliminated in one of the two memory cells (DRAM cells) forming the twin-cell unit. Thereby, a large charge holding capacity can be ensured in each of the cell plates, which are electrically isolated corresponding to the respective storage units (twin-cell units). Accordingly, the refresh characteristics of the semiconductor memory device can be further improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A memory cell structure of a twin-cell DRAM according to an embodiment of the invention, which has improved refresh characteristics, will now be described with reference to the drawings.

Figure 1:
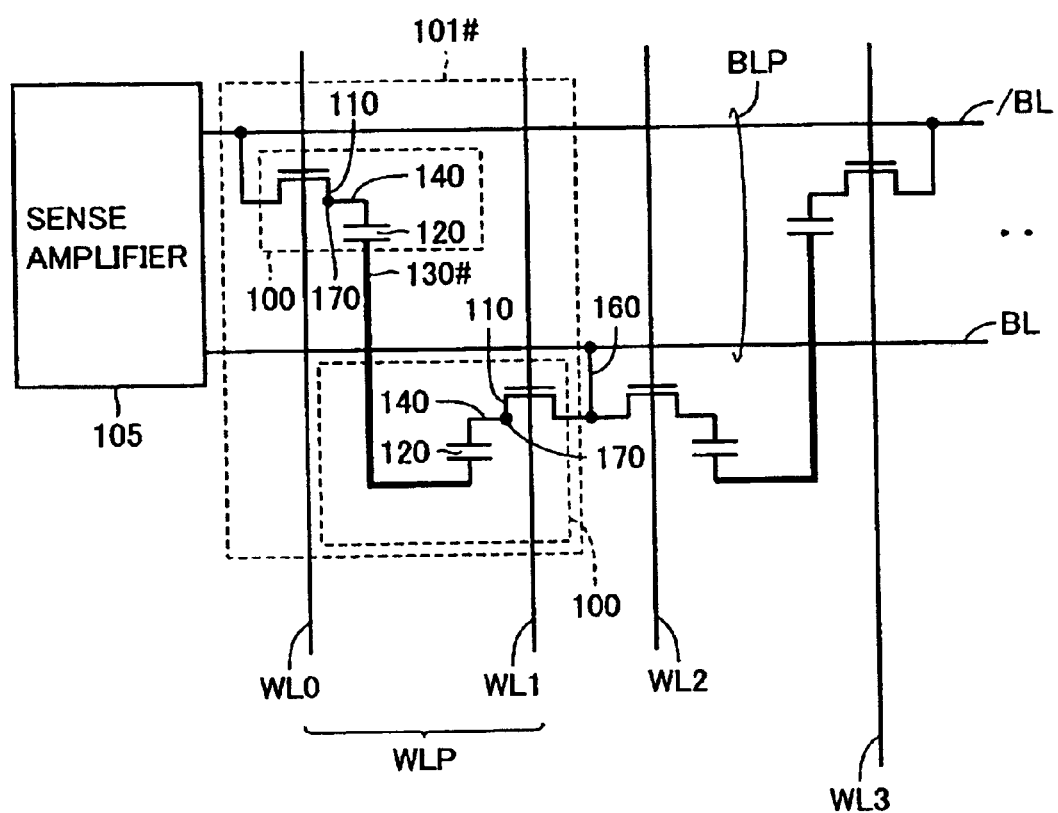
FIG. 1 schematically shows a structure of a memory array portion of a semiconductor memory device according to a first embodiment of the invention.
Figure 17:
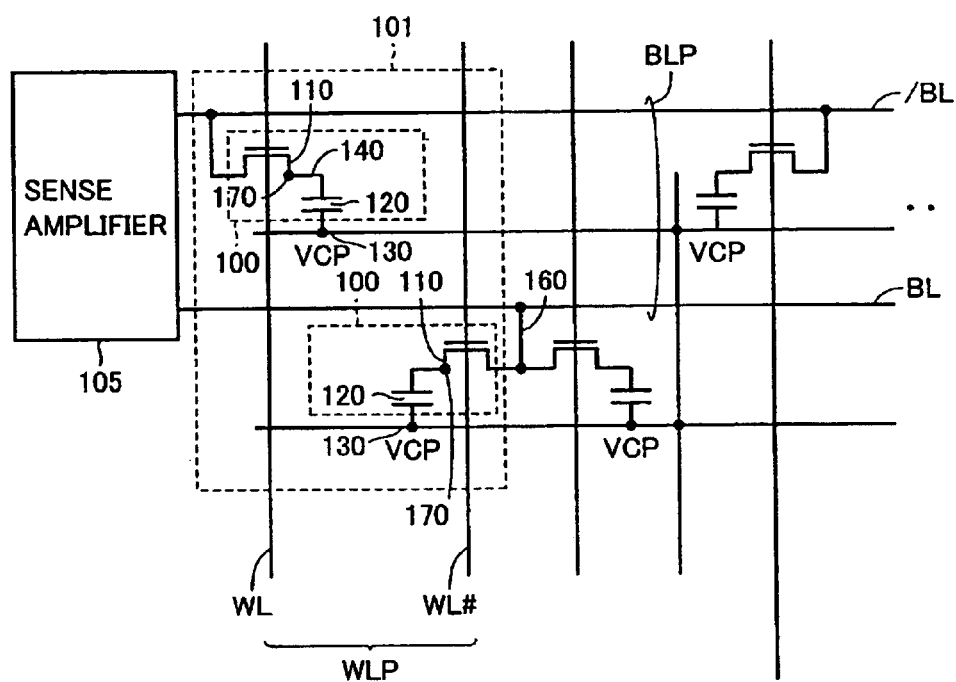
FIG. 17 shows an array structure of a conventional twin-cell DRAM.
Figure 18:
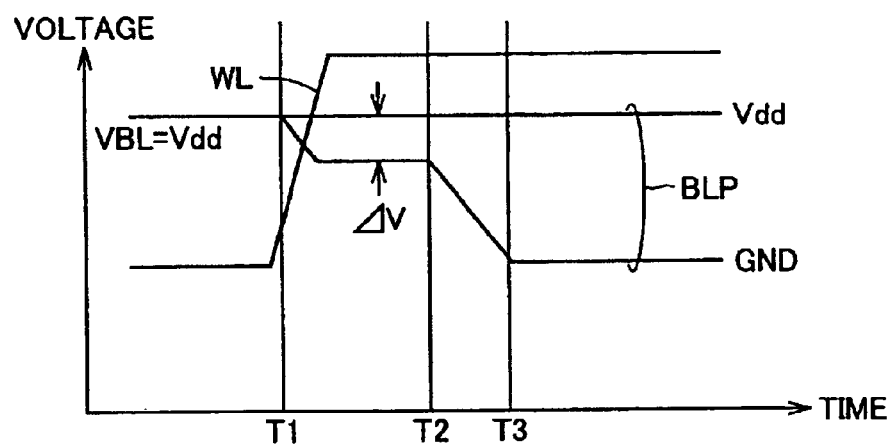
FIG. 18 is an operation waveform diagram illustrating a behavior of voltages on a bit line pair exhibited when power supply voltage Vdd is used as a bit line precharge voltage in the twin-cell DRAM shown in FIG. 17.
Figure 19:
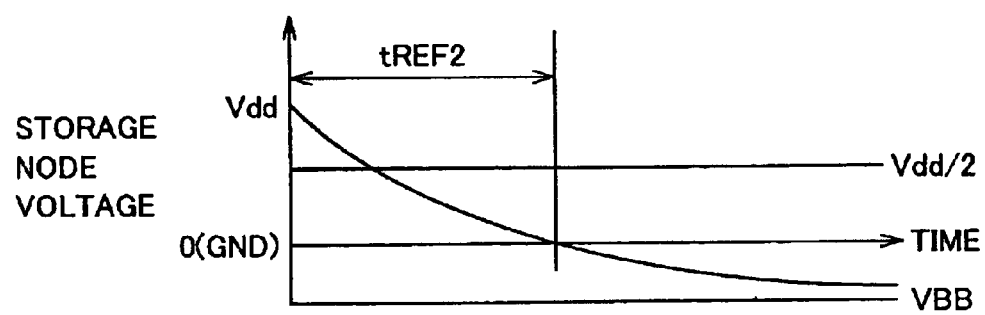
FIG. 19 is a waveform diagram illustrating a refresh time in the conventional twin-cell DRAM.

Referring to FIG. 1, a twin-cell unit 101# according to a first embodiment is formed of two DRAM cells 100, which are connected to paired complementary bit lines BL and /BL, respectively, similarly to a conventional twin-cell unit 101 shown in FIG. 17. Each DRAM cell 100 includes an access transistor 110 and a capacitor 120, as is already described with reference to FIG. 17. Access transistors 110 of two DRAM cells 100 forming twin-cell unit 101# have gates connected to two word lines (e.g., word lines WL0 and WL1) forming a word line pair WLP, respectively.

In the twin-cell DRAM according to the first embodiment, a cell plate structure is formed of isolated cell plates 130#, which are divided from each other and correspond to twin-cell units 101#, respectively. Each isolated cell plate 130# is separated at least electrically from the others. Typically, patterning is performed to provide the cell plates divided corresponding to respective twin-cell units 101# so that each isolated cell plate 130# is physically separated.

Figure 2:
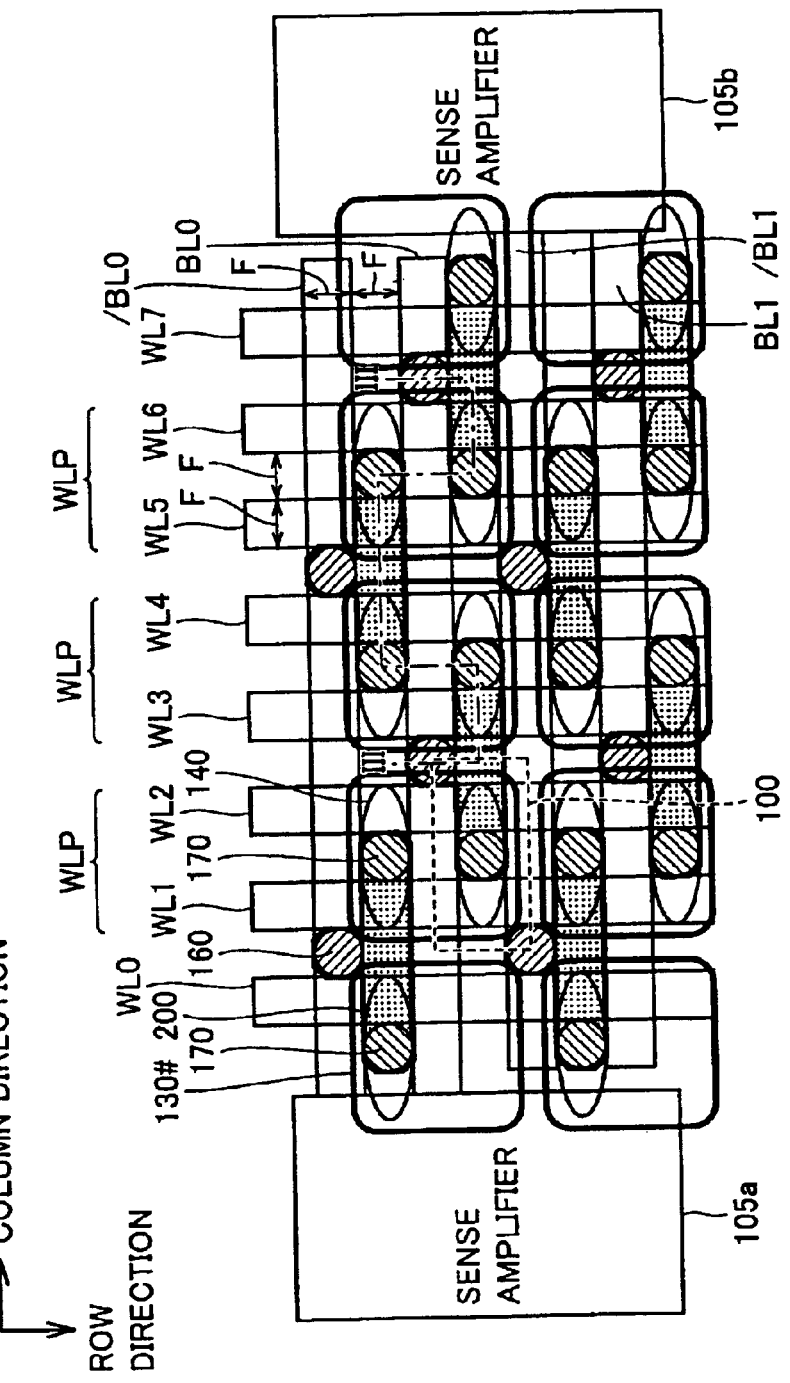
FIG. 2 schematically shows a layout of the memory array portion of the semiconductor memory device according to the first embodiment.

FIG. 2 schematically shows a layout of a memory array portion in the semiconductor memory device according to the first embodiment.

Referring to FIG. 2, active regions (field regions) 200 each having an inverted T-shaped from are arranged in rows and columns. Each active region 200 is long in an extending direction of the bit line (i.e., in the column direction), and has a projection projecting in an extending direction of the word line (i.e., in the row direction). Each field region 200 forms one layout unit, in which two DRAM cells 100 are arranged. Thus, each field region 200 continuously extends between the two DRAM cells neighboring to each other in the column direction. Thus, field region 200 defines a formation region of access transistor 110 shown in FIG. 1.

Field regions 200 in each column are shifted by two rows from field regions 200 in the neighboring column. Bit lines BL are arranged for every two columns of field regions 200, respectively, and bit lines /BL are arranged for the other alternate columns, respectively. FIG. 2 shows, as a typical example, bit lines BL0 and /BL0, and BL1 and /BL1.

Bit lines BL0 and /BL0 form a pair, and bit lines BL1 and /BL1 form another pair. Bit line pair BL0 and /BL0 is connected to a sense amplifier 105a, and bit line pair BL1 and /BL1 is connected to a sense amplifier 105b. Each of bit lines BL0, /BL0, BL1 and /BL1 is electrically connected to the projected portions of field regions 200 in the corresponding memory cell column via bit line contacts 160, respectively.

In each field region 200, two storage nodes 140 are arranged corresponding to two DRAM cells 100, respectively, and are located on the opposite sides of bit line contact 160, respectively. Storage nodes 140 are aligned in the row and column directions. Storage node 140 is electrically connected to field region 200 via storage node contact 170. Storage node contacts 170 are aligned in the row and column directions, similarly to storage nodes 140.

Storage node contacts 170 in each column are located at positions corresponding to every two rows, and storage node contacts 170 in each row are arranged at positions corresponding to all the columns except for the row at the end position. The rows, in which bit line contacts 160 are arranged, alternate with the rows of storage node contacts 170. Word lines WL extend across field regions 200, and are arranged such that bit line contacts 160 and storage node contacts 170 are located between word lines WL. FIG. 2 representatively shows word lines WL0–WL7. In the whole memory cell array, the layout shown in FIG. 2 is repeated in the row and column directions. In the figures, "F" indicates a minimum design unit (minimum line width). Each of the word and bit lines has a with equal to F, and the word and bit lines are arranged at pitches each equal to F.

In each DRAM cell 100, capacitor 120 shown in FIG. 1 is formed between corresponding storage node 140 and isolated cell plate 130# for holding charges corresponding to stored data.

In the structure according to the first embodiment, as described above, two DRAM cells 100 neighboring to each other in the row direction form one twin-cell unit, and isolated cell plate 130# is arranged corresponding to each twin-cell unit. In contrast to a conventional structure, in which a cell plate serving as a common electrode is arranged over the whole memory cell array, the structure according to the first embodiment employs the cell plates, each of which is provided for two DRAM cells 100 forming the same twin-cell unit, and is isolated from the others. Each isolated cell plate 130# is not supplied with a specific voltage, and is electrically floated.

Further, the two word lines on the opposite sides of storage node contact 170 form word line pair WLP, and are simultaneously selected. Accordingly, word lines WL1 and WL2, word lines WL3 and WL4, and word lines WL5 and WL6 form word line pairs WLP.

In the structure of the twin-cell type shown in FIG. 2, word lines WL0 and WL7 on the opposite ends are depicted as if these were dummy word lines. However, the arrangement shown in FIG. 2 is repeated in the row and column directions.

Figure 3:
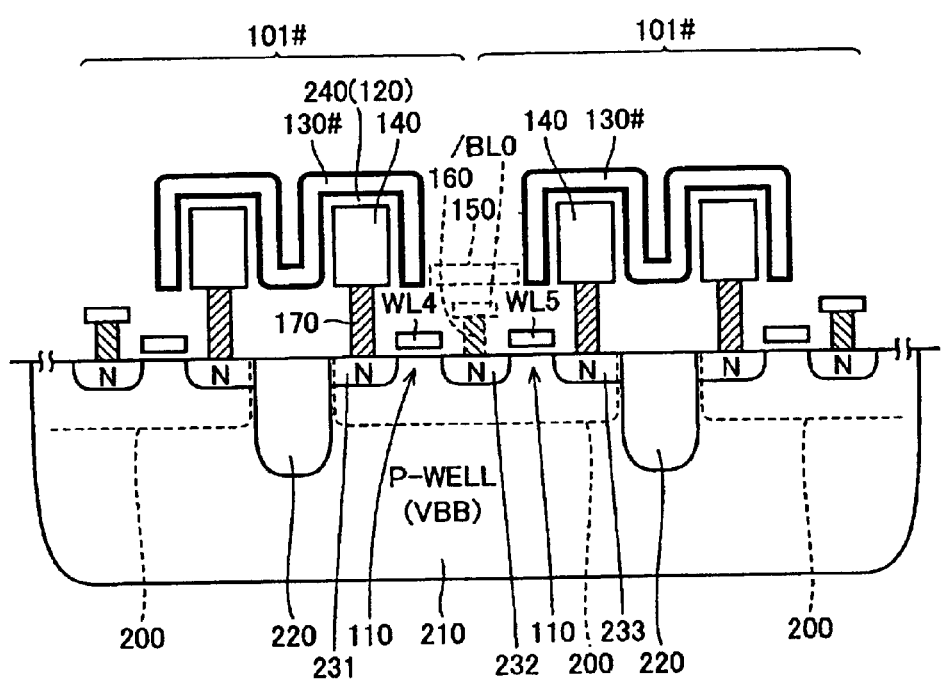
FIG. 3 is a cross section of structures of memory cells in the semiconductor memory device according to the first embodiment shown in FIG. 2.

FIG. 3 shows a section taken along line III—III in FIG. 2.

Referring to FIG. 3, field regions 200, which are isolated from each other by isolating and insulating films 220, are arranged on P-wells 210 carrying a negative voltage VBB. Impurity regions 231–233 serving as source/drain regions of access transistors 110 are arranged on field region 200. Word line WL4 made of a polycrystalline silicon layer is formed immediately above an active region between impurity regions 231 and 232 with an insulating film therebetween. Likewise, word line WL5 made of a polycrystalline silicon layer is formed immediately above an active region between impurity regions 232 and 233 with the insulating film therebetween.

Further, impurity region 232 commonly used by access transistors 110 of the neighboring two DRAM cells is electrically connected to bit line /BL0 made of a first metal layer via bit line contact 160 in the projected portion of the field region shown in FIG. 2.

Storage node 140 provided for each DRAM cell is electrically connected to impurity region 231 or 233 via storage node contact 170. Isolated cell plate 130# is opposed to storage node 140.

As can be seen also in FIG. 3, isolated cell plate 130# is separated along a boundary between twin-cell units 101#. For example, a metal film, which will form isolated cell plate 130#, is deposited in a film depositing process, and then a portion of this metal film located in a separation region 150 between the isolated cell plates is removed, whereby isolated cell plates 130# can be formed without employing a special manufacturing manner.

Each twin-cell unit 101# is provided with a capacity film, which is formed in a gap 240 between isolated cell plate 130# and storage node 140 for ensuring a capacity value of capacitor 120.

FIG. 3 shows by way of example a COB (Capacitor over Bit line) structure, in which storage node 140 and isolated cell plate 130# are formed at a higher level than bit line BL. However, the invention may employ a CUB (Capacitor under Bit line) structure, in which storage node 140 and isolated cell plate 130# are formed at a lower level than bit line BL.

Figure 4:
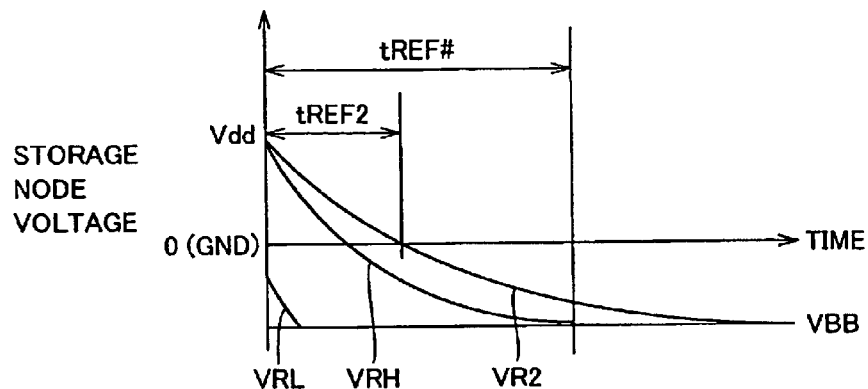
FIG. 4 is a waveform diagram illustrating a refresh time in the semiconductor memory device according to the first embodiment.

FIG. 4 illustrates a storage node voltage waveform for illustrating a refresh time in the twin-cell unit according to the first embodiment.

FIG. 4 illustrates a curve representing changes in a storage node voltage VR2 in a conventional twin-cell unit during H-level storage, and also illustrates curves representing changes in storage node voltages VRH and VRL on storage nodes, which store H-level and L-level, and may be referred to as an "H-side storage node" and an "L-side storage node" hereinafter, respectively.

In the twin-cell DRAM of the conventional structure, as already described, refresh time tREF2 is defined by a time required for lowering storage node voltage VR2 from power supply voltage Vdd to ground voltage GND.

In the twin-cell unit according to the first embodiment, the storage nodes, which are included in the same twin-cell unit and carry complementary data (i.e., H- and L-level data), respectively, are connected in series by isolated cell plate 130#. Therefore, when storage node voltage VRH at the H-level lowers, voltage VRL on the storage node at the L-level likewise lowers owing to the capacitive coupling.

Accordingly, storage node voltage VRL at the L-level lowers to or below ground voltage GND, but is clamped at negative voltage VBB, i.e., a substrate voltage, without lowering below negative voltage VBB. This is because PN junctions formed between P-well 210 and impurity regions 231 and 233 (N-type regions), which are electrically connected to storage nodes 140, are forwardly biased.

When lower storage node voltage VRL lowers to a negative voltage, this may turn on a select transistor, which has a source formed of an impurity region electrically connected to the storage node on the L-side as well as a gate formed of an unselected word line (bearing ground voltage GND). Thus, the access transistor may be turned on before lower storage node voltage VRL lowers to negative voltage (substrate voltage) VBB. In this case, lower storage node voltage VRL is clamped at a negative voltage of (GND−Vth) affected not by substrate voltage VBB but by a threshold voltage Vth of the access transistor. In any case, lower storage node voltage VRL is clamped at either substrate voltage VBB or the negative voltage of (GND−Vth).

In contrast to the above, higher storage node voltage VRH will continue to lower even after lower storage node voltage VRL is clamped, and will finally lower to the same level as lower storage node voltage VRL, whereby the storage data in the twin-cell unit is lost.

If a junction leak current in the twin-cell unit according to the first embodiment occurs at the same level as that in the conventional twin-cell unit, higher storage node voltage VRH in the twin-cell unit according to the first embodiment lowers more rapidly than the higher storage node voltage in the conventional twin-cell unit. This is because two capacitors each having a capacity value Cs are connected in series in the twin-cell unit according to the first embodiment so that the held capacity value for the isolated cell plate according to the first embodiment is equal to Cs/2, and thus is equal to half the value of the conventional twin-cell unit.

As described above, higher storage node voltage VRH in the twin-cell unit according to the first embodiment lowers more rapidly than the conventional twin-cell unit. However, a refresh time tREF# is defined by the time elapsing before it lowers from power supply voltage Vdd to negative voltage VBB (or (GND−Vth)). As already described, therefore, refresh time tREF# ensured in the twin-cell unit according to the first embodiment is approximately twice as large as refresh time tREF2 in the conventional twin-cell unit. This was confirmed by a simulation performed with a power supply voltage Vdd of 2 (V) a substrate voltage VBB of −1 (V), cell capacitance Cs of 25 (fF) and bit line capacitance Cb of 100 (fF).

In the twin-cell DRAM according to the first embodiment, the cell plates are isolated corresponding to the twin-cell units, respectively. Thereby, such a design can be employed that the voltages on the storage nodes storing the complementary data change similarly owing to the capacitive coupling. Therefore, the refresh time can be extended.

Provision of the isolated cell plate structure described above can also achieve the following effect.

According to the twin-cell unit of the first embodiment, even if a short circuit caused during manufacturing is present between the storage node and another node (typically, word line), the voltage on the L-level storage node lowers from ground voltage GND to the negative voltage owing to the capacitive coupling as the voltage on the H-level storage node lowers from power supply voltage Vdd to ground voltage GND. Therefore, even when a short circuit to the storage node is present in one of the two DRAM cells forming the twin-cell unit, a voltage difference is still kept to a certain extent between the H-level and L-level storage nodes. Consequently, it is possible to avoid such a situation that the short-circuited DRAM cell becomes faulty.

A similar effect can be achieved not only in the case where the short circuit occurs between the storage node and the word line, but also in such cases that a short circuit occurs between the storage node and the bit line, and that a short circuit or the like occurs between the storage node and the cell plate. Therefore, the twin-cell DRAM according to the first embodiment can provide higher manufacturing yield than the conventional twin-cell DRAM.

By changing cell plates 130# shown in FIG. 2 from the isolated pattern to a continuous patter, the structure can be easily changed to provide memory cells for a conventional single-cell DRAM. This is an additional effect.

Second Embodiment

In the twin-cell DRAM, it is important to arrange the DRAM cells at a high density for reducing a layout area, as already described. Therefore, second and third embodiments will now be described in connection with layouts for efficiently arranging the twin-cell units, which have been described in connection with the first embodiment.

Figure 5:
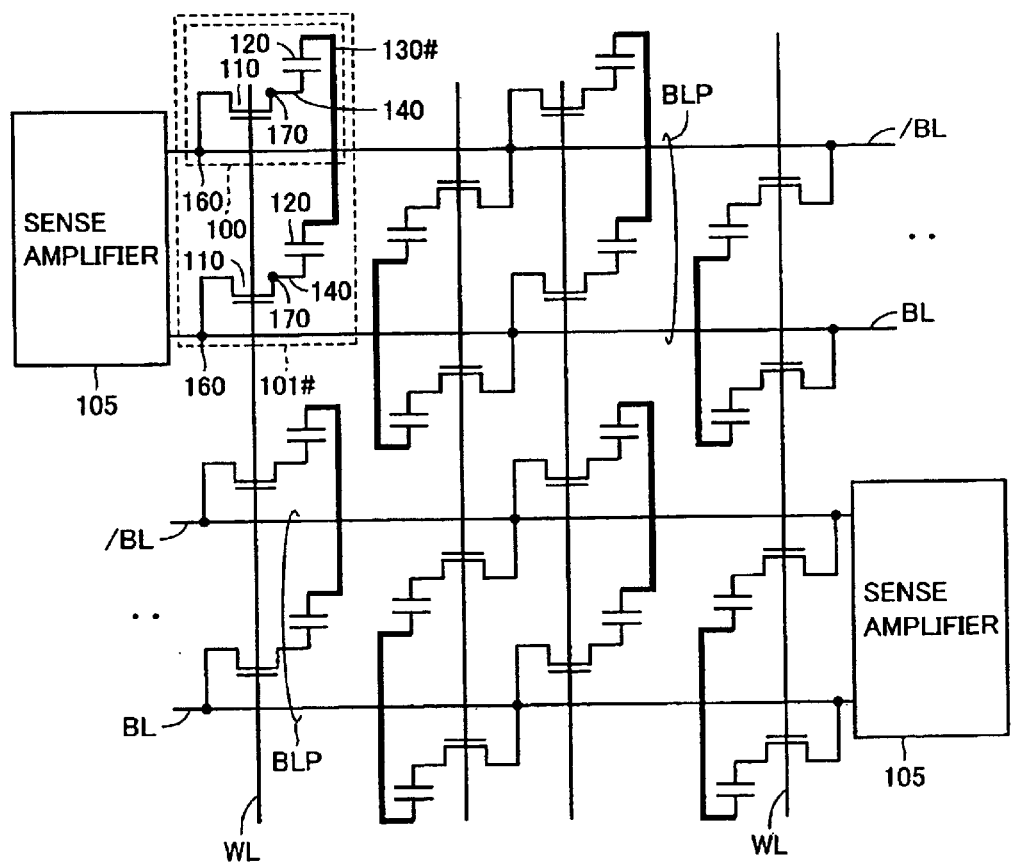
FIG. 5 schematically shows a structure of a memory array portion of a semiconductor memory device according to a second embodiment of the invention.

Referring to FIG. 5, which shows a structure according to the second embodiment, two DRAM cells 100 forming the same twin-cell unit 101# are selected by common word line WL. Structures of the second embodiment other than the above are substantially the same as those of the first embodiment. Therefore, corresponding portions bear the same reference numbers, and description thereof is not repeated.

Figure 6:
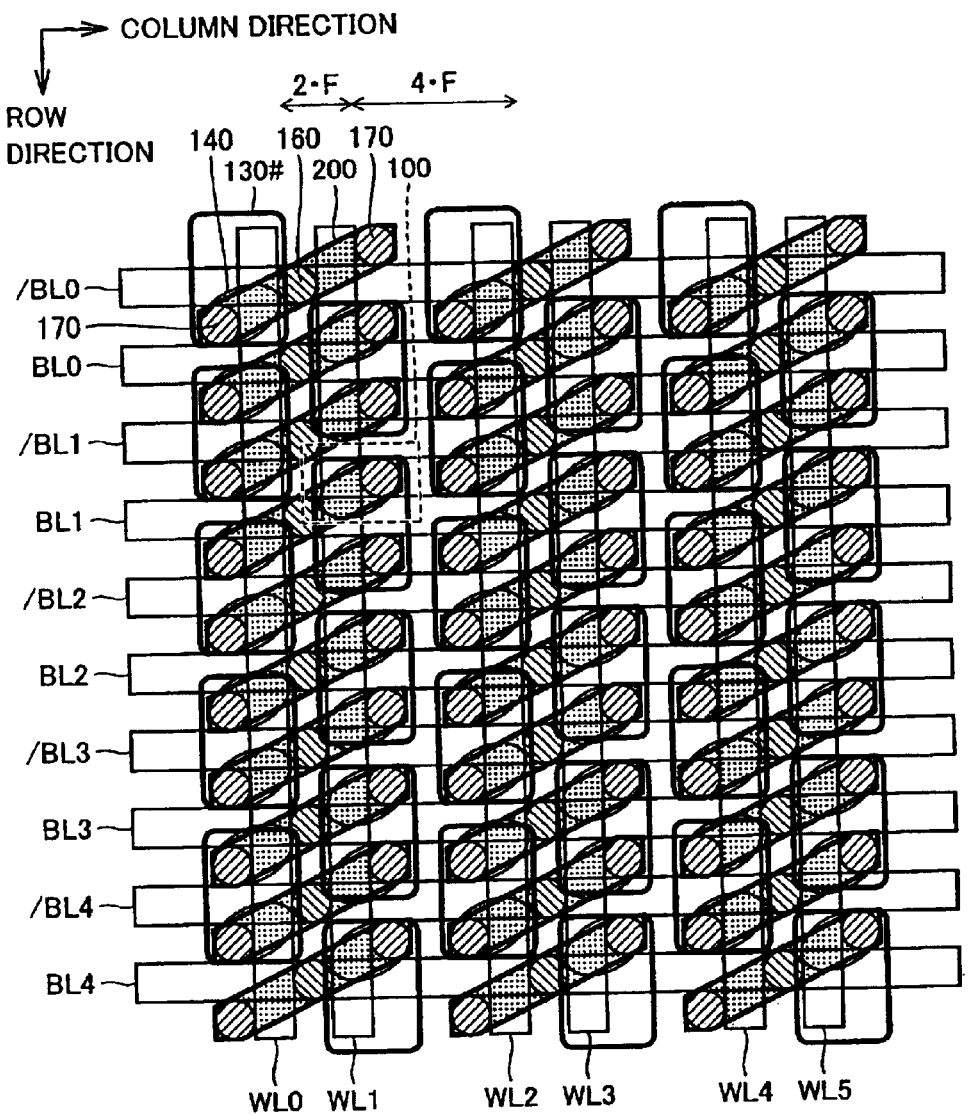
FIG. 6 schematically shows a layout of the memory array portion of the semiconductor memory device according to the second embodiment.

FIG. 6 schematically shows a layout of a memory array portion in the semiconductor memory device according to the second embodiment.

In FIG. 6, word lines WL0-WL5 extend in the row direction. Bit lines BL0 and /BL0–BL4 and /BL4 extend in the column direction. Word lines WL0–WL5 extend across (typically, perpendicularly to) bit lines BL0 and /BL0–BL4 and /BL4. As already described with reference to FIG. 3, word lines WL0–WL5 are formed of, e.g., polycrystalline silicon interconnections, and bit lines BL0 and /BL0–BL4 and /BL4 are made of, e.g., first metal layer at a higher level or position. Each field region 200 is arranged in a direction crossing word lines WL0–WL5 and bit lines BL0 and /BL0–BL4 and /BL4. In the structure according to the second embodiment, field region 200 extends in a direction intermediate between the extending direction of word line WL and the extending direction of bit lines BL and /BL. Each field region 200 is provided with two DRAM cells 100, similarly to the layout of the first embodiment.

Bit line contact 160 is formed between each field region 200 and corresponding one of bit lines BL0 and /BL0–BL4 and /BL4. Each field region 200 has ends, each of which is spaced from bit line contact 160 with word line WL (generally indicating WL0–WL5) therebetween, and storage node contacts 170 are arranged in these ends, respectively.

Storage nodes 140 are electrically connected to field region 200 via storage node contacts 170 arranged at the opposite ends of field region 200, respectively. Storage node 140 is formed corresponding to each DRAM cell 100, and is located at a region above field region 200.

According to the structure of the second embodiment, as described above, the cell plate opposed to storage node 140 is formed of isolated cell plate 130#, which corresponds to each twin-cell unit, and is isolated from the others, similarly to the first embodiment. Therefore, the structure in the second embodiment likewise achieves such effects that the refresh characteristics are improved, and production of a faulty cell can be suppressed even when a short circuit occurs between the storage node and another node, as can be done in the first embodiment. Thus, the first and second embodiments differ from each other only in the layout and arrangement of the twin-cell units. In the memory array, the arrangement shown in FIG. 6 is repeated in the row and column directions.

In the layout according to the second embodiment, two kinds of pitches are employed for arranging word lines WL. More specifically, word lines (e.g., word lines WL0 and WL1) on the opposite sides of bit line contact 160 are arranged at the pitch of 2·F. However, word lines (e.g., word lines WL1 and WL2) on the opposite sides of storage node contact 170 are arranged at the pitch of 4·F. Word lines WL are arranged at these pitches, which alternately change between 2·F and 4·F.

Bit line contacts 160 are aligned in the row direction, and are arranged corresponding to respective bit lines BL and /BL. Storage node contacts 170 are likewise aligned in the row direction, and are arranged corresponding to the respective memory cell columns. Bit lines BL and /BL are arranged at the pitch of 2·F. Bit line contacts 160 are arranged at the pitch of 6·F in the column direction.

Therefore, the basic cell region forming DRAM cell 100 is defined by a rectangular region including one bit line contact 160 and one storage node contact 170. This basic cell region has a length of 2·F in the row direction and a length of 3·F in the column direction, and thus has an area of 6·F².

In contrast to the above, the basic cell region forming DRAM cell 100 in the layout according to the first embodiment shown in FIG. 2 has a length of 2·F in the row direction and a length of 4·F in the column direction. Therefore, the basic cell region has an area of 8·F². Therefore, the layout according to the second embodiment can reduce the area occupied by the basic cell region forming one DRAM cell, and allows arrangement of the DRAM cells at a higher density, as compared with the layout according to the first embodiment. Consequently, it is possible to increase the density of the cells in the twin-cell DRAM according to the first embodiment.

Third Embodiment

Figure 7:
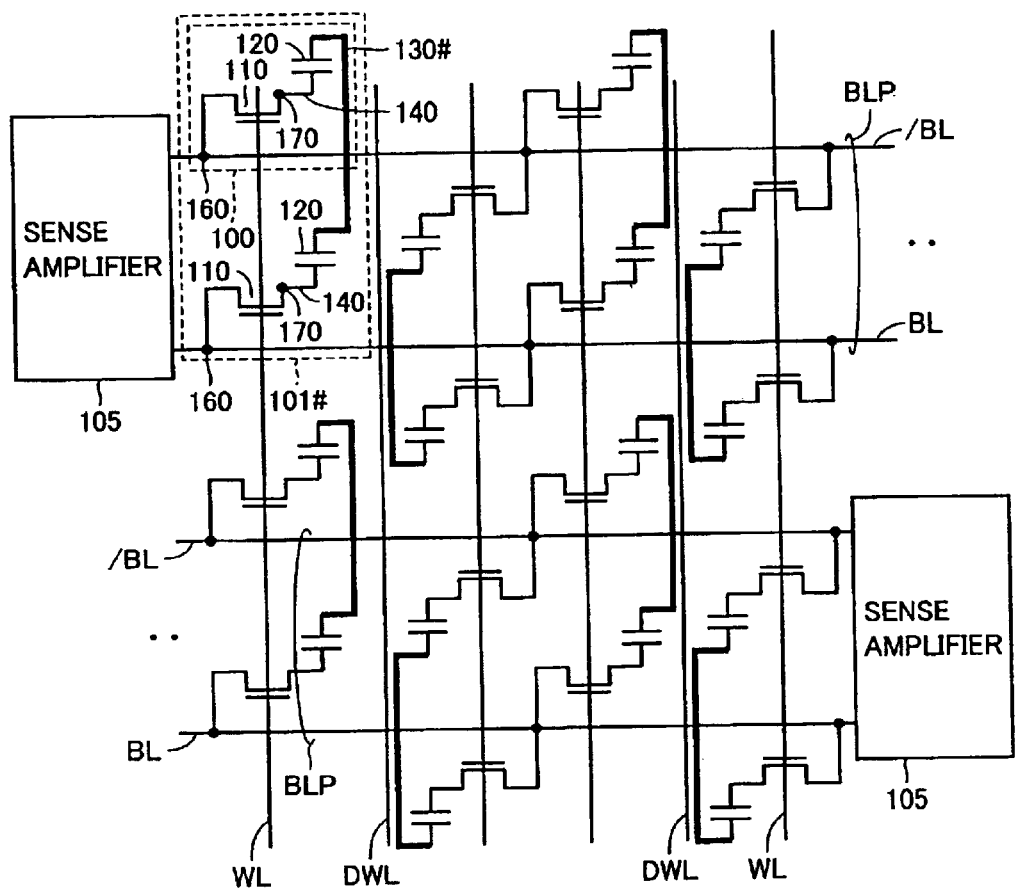
FIG. 7 schematically shows a structure of a memory array portion of a semiconductor memory device according to a third embodiment of the invention.

FIG. 7 schematically shows a structure of a memory array portion in a semiconductor memory device according to a third embodiment of the invention.

Referring to FIG. 7, a structure according to the third embodiment includes dummy word lines DWL formed along word lines WL, in addition to the structures of the second embodiment shown in FIG. 5. Structures other than the above are substantially the same as those according to the second embodiment shown in FIG. 5. Corresponding portions bear the same reference numbers, and description thereof is not repeated.

Figure 8:
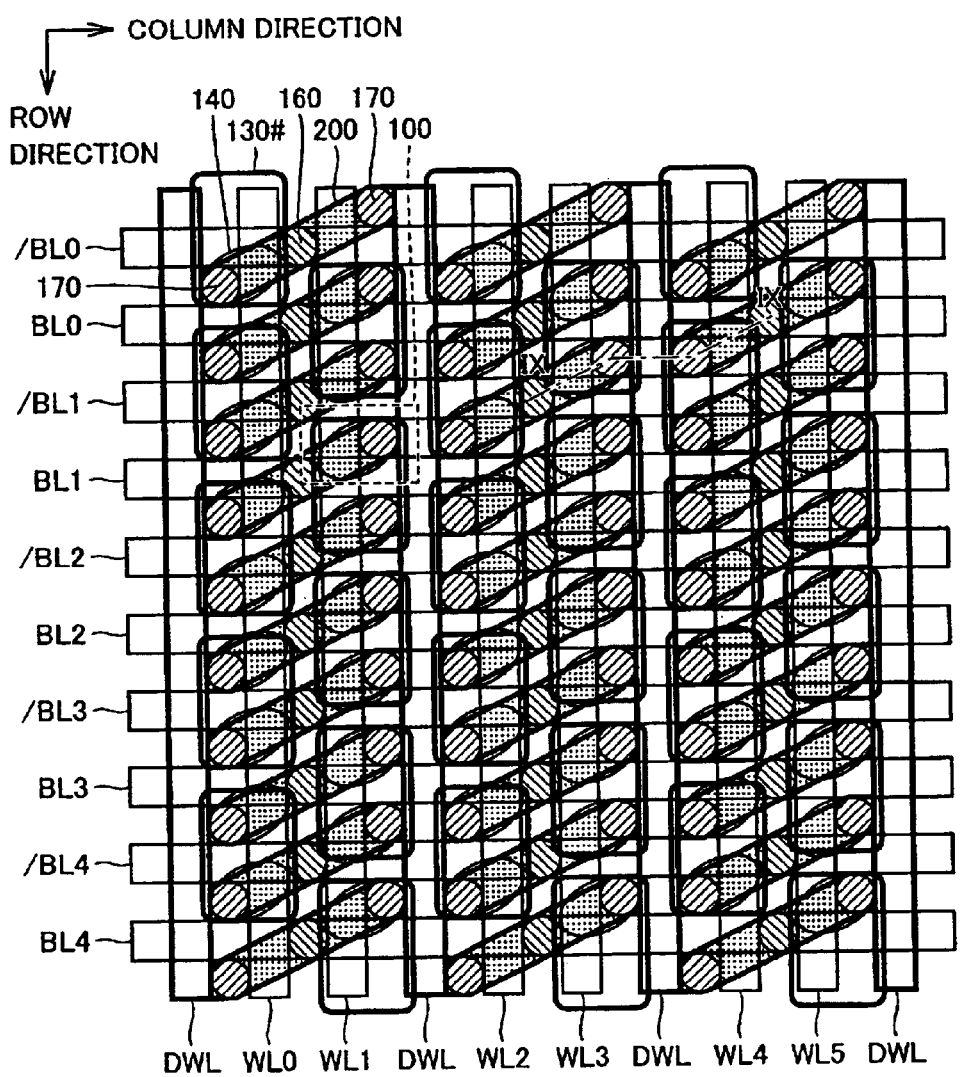
FIG. 8 schematically shows a layout of the memory array portion of the semiconductor memory device according to the third embodiment.

FIG. 8 schematically shows a layout of a memory array portion in the semiconductor memory device according to the third embodiment.

Referring to FIG. 8, the layout according to the third embodiment differs from the layout according to the second embodiment shown in FIG. 6 in the following points. Dummy word line DWL is arranged between storage node contacts 170, which are formed in field regions 200 neighboring to each other in the column direction, respectively. Thus, dummy word line DWL is arranged between word lines WL arranged at the pitch of 4·F. Further, as shown in FIG. 8, dummy word line DWL may be arranged outside word line WL in each outermost position for ensuring a continuity of the form or configuration. The layout of portions other than the above is substantially the same as that in FIG. 6. Therefore, corresponding portions bear the same reference numbers, and description thereof is not repeated.

These dummy word lines DWL are formed in the same interconnection layer as word lines WL, and are produced in the same manufacturing steps as word lines WL. Therefore, dummy word lines DWL can be arranged without an additional manufacturing step and an additional mask.

Dummy word lines DWL are arranged at a pitch of 2·F with respect to word lines WL (WL0–WL5). Therefore, the word lines including word lines WL and dummy word lines DWL are arranged at the uniform pitch of 2·F, and word lines WL and dummy word lines DWL can be arranged regularly. Thereby, the uniform pattern for arrangement can be repeated, and it is possible to suppress an influence due to irregular reflection of exposure light beams at a stepped portion, which may be caused by irregularity of the patterns, so that the patterning can be performed accurately. Thereby, patterning for the storage node and others can be accurately performed even in microscopic processing.

Figure 9:
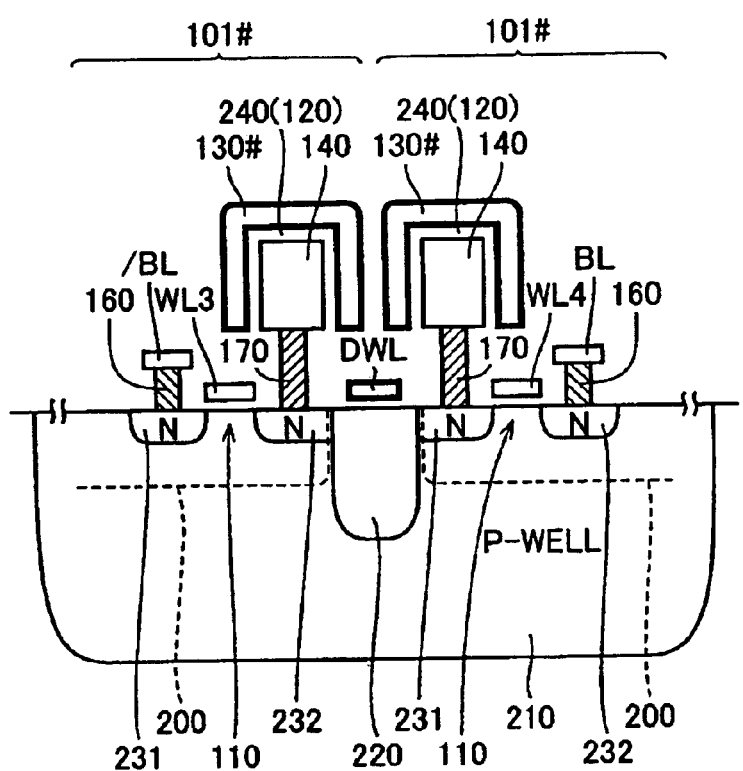
FIG. 9 is a cross section showing structures of memory cells in the semiconductor memory device according to the third embodiment shown in FIG. 8.

FIG. 9 shows a section taken along line IX—IX in FIG. 8.

Referring to FIG. 9, field regions 200 located on the opposite sides of dummy word line DWL are electrically isolated from each other by isolating and insulating film 220.

Isolating and insulating film 220 has a surface flattened, e.g., by CMP (Chemical Mechanical Polishing). In this manner, processing is usually performed to reduce a stepped portion on a base surface for forming dummy word line DWL thereon so that word lines WL and dummy word lines DWL can be formed in the same manufacturing step.

In respective field regions 200, the DRAM cells forming different twin-cell units 101# are formed. Therefore, isolated cell plates 130# in these DRAM cells are isolated from each other. The structure of each DRAM cell is substantially the same as that already described with reference to FIG. 3. Therefore, corresponding portions bear the same reference numbers, and description thereof is not repeated.

Each dummy word line DWL is always fixed at ground voltage GND or a negative voltage lower than ground voltage GND. Thereby, a lower portion of thick isolating and insulating film 220 between field regions 200 attracts positive charges to form a potential barrier against electrons in field region 200. This increase a degree of insulation between two field regions 200 electrically isolated by isolating and insulating film 220, and can increase a degree of insulation between the storage nodes forming different twin-cell units 101#, respectively. Consequently, each DRAM cell isolated by isolating and insulating film 220 can stably store the data.

In the twin-cell DRAM according to the third embodiment, as described above, the dummy word line located at the same interconnection layer as the word lines are arranged in the region between the storage nodes neighboring to each other in the column direction, and all the word lines can be arranged equivalently at the uniform pitch. Consequently, in addition to the effects achieved by the twin-cell DRAM according to the second embodiment, the third embodiment can achieve such an effect that the dimensional accuracy can be further improved in the microscopic processing.

By applying a predetermined voltage to the dummy word line, the potential barrier for electrically isolating the storage nodes, which belong to the different twin-cell units, respectively, can be formed in a region of the layer under the dummy word line. Therefore, the data storage in each DRAM cell can be further stable.

First Modification of Third Embodiment

Figure 10:
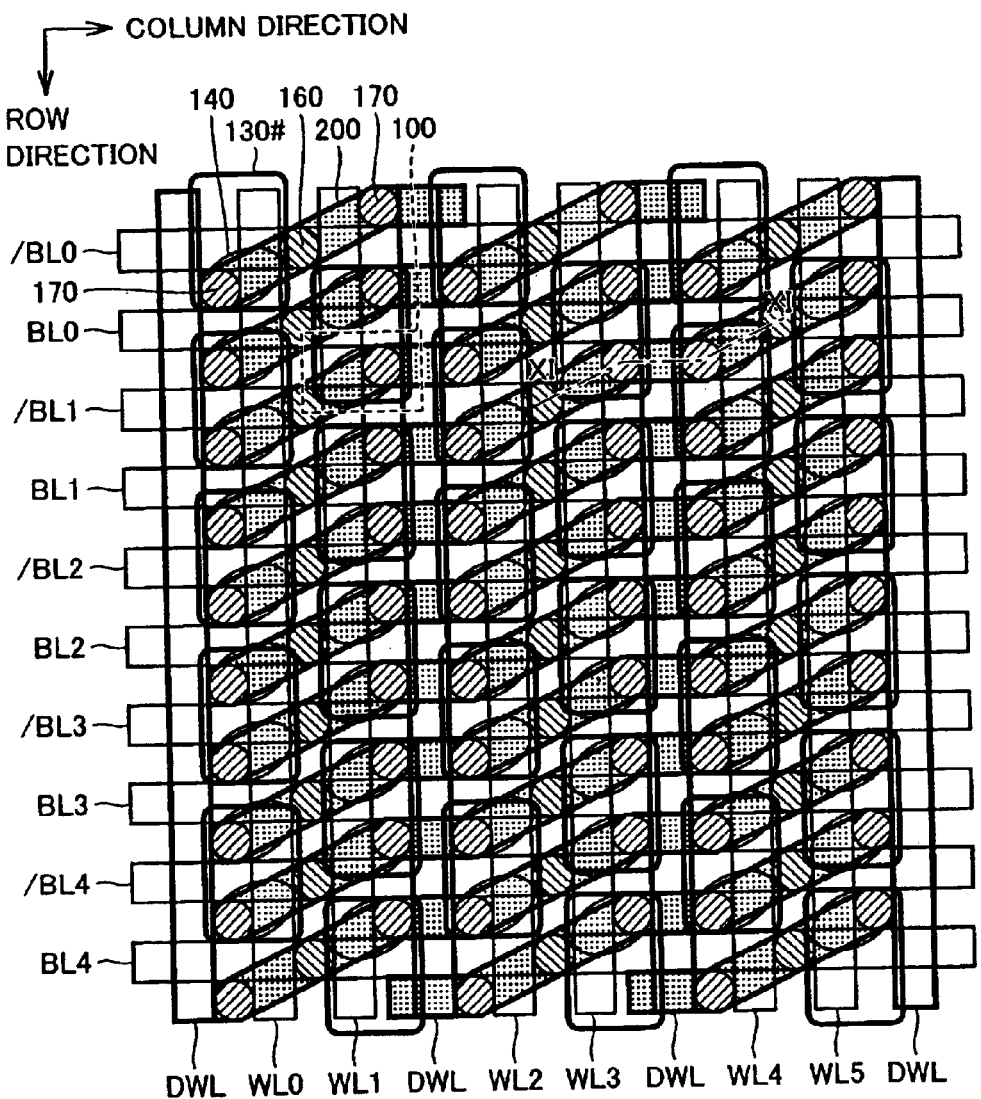
FIG. 10 schematically shows a layout of a memory array portion of a semiconductor memory device according to a first modification of the third embodiment.

FIG. 10 schematically shows a layout of a memory array portion of a semiconductor memory device according to a first modification of the third embodiment.

In the layout shown in FIG. 10, a field region is also formed in a region under each dummy word line DWL, and therefore, field region 200 has a continuously extending form. Field region 200 is formed by continuously connecting the field regions of the DRAM cells in the neighboring rows and neighboring columns, and extends in a uniform direction. The field region formed in a region under each dummy word line DWL extends straight in the column direction, and physically connects field regions 200 provided for storage nodes 140 arranged on the opposite sides of the dummy word line DWL. Each dummy word line DWL is supplied with ground voltage GND or the negative voltage, as is done in the third embodiment.

Figure 11:
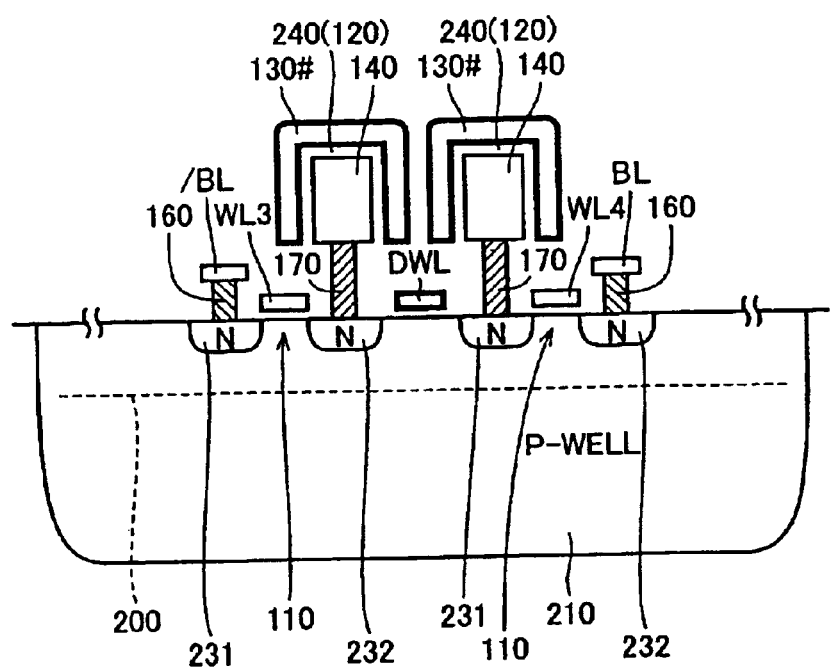
FIG. 11 is a cross section showing structures of memory cells in the semiconductor memory device according to the first modification of the third embodiment shown in FIG. 10.

FIG. 11 is a cross section taken along line XI—XI in FIG. 10.

Referring to FIG. 11, field region 200 continuously extends through a region under dummy word line DWL. The DRAM cells each having the structure already described with reference to FIGS. 3 and 9 are formed in the regions on the opposite sides of dummy word line DWL.

Dummy word line DWL is supplied with ground voltage GND or a negative voltage at a predetermined level. The predetermined voltage thus supplied turns off a transistor formed between impurity regions 231 and 232, which are located on the opposite sides of dummy word line DWL, respectively. Therefore, the two regions on the opposite sides of dummy word line DWL are electrically isolated from each other.

Accordingly, even if field region 200 is continuously formed at the surface of P-well 210, dummy word line DWL can reliably and electrically isolate the storage nodes, which correspond to different DRAM cells, respectively, from each other.

According to the first modification of the third embodiment, as described above, the field regions are formed even under the dummy word lines, and these field regions can be continuously formed in a striped pattern. Therefore, it is not necessary to provide a thick isolating and insulating film for isolating the field regions corresponding to the neighboring storage nodes from each other. Accordingly, in addition to the effect of the third embodiment, such an effect can be achieved that the field regions can be easily patterned. Further, an insulating film for isolating the field is not required so that the layout area of the basic cell region for forming the DRAM cell can be reduced, and the microscopic memory cells can be achieved.

Further, by applying a predetermined voltage to the dummy word line, the transistor in this field region can be turned off so that the storage nodes of memory cells can be accurately isolated from each other, and the data can be stored accurately.

Second Modification of Third Embodiment

Figure 12:
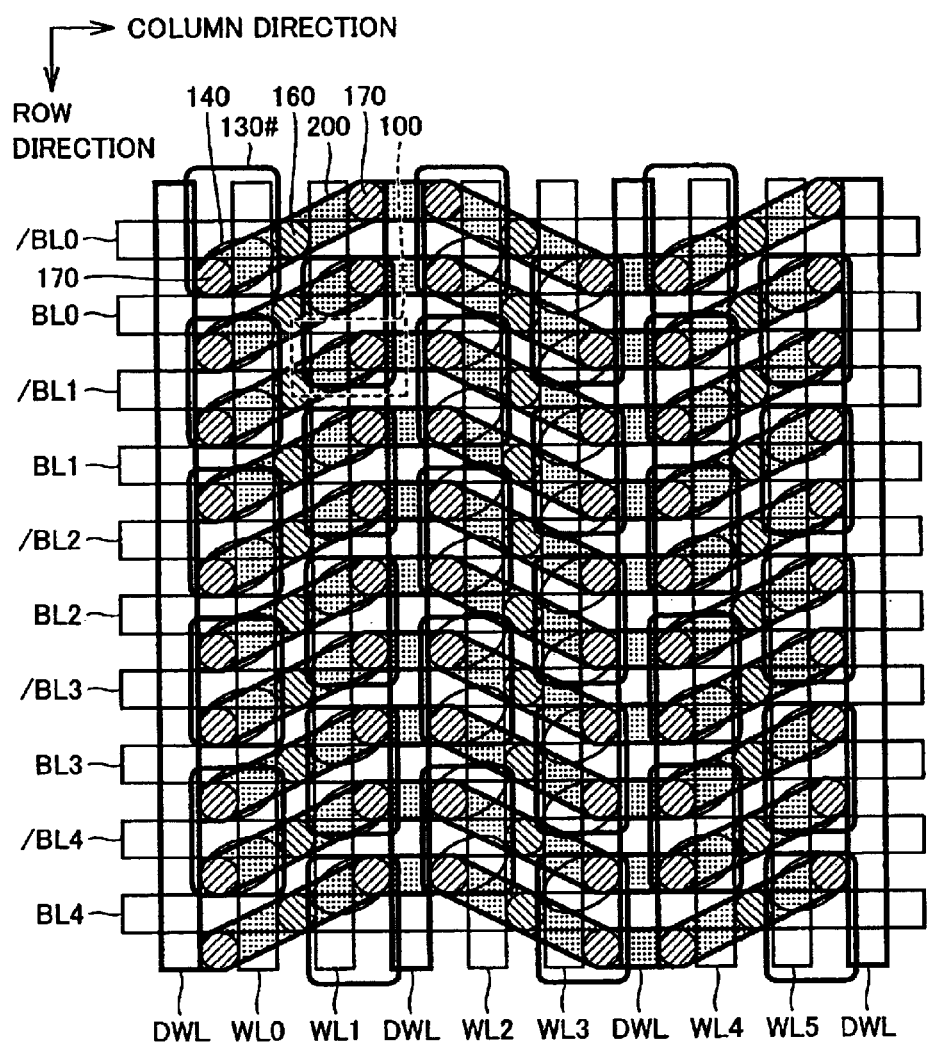
FIG. 12 schematically shows a layout of a memory array portion of a semiconductor memory device according to a second modification of the third embodiment.

FIG. 12 schematically shows a layout of a memory array portion of a semiconductor memory device according to a second modification of the third embodiment. FIG. 12 likewise represents word lines WL0–WL5, dummy word lines DWL, and bit lines BL0 and /BL0–BL4 and /BL4.

In the layout shown in FIG. 12, field regions 200 are symmetric with respect to dummy word line DWL, and alternate field regions 200 in each column are inclined reversely to the other field regions 200 in the same column. Field region 200 is formed of the field regions, which are continuously formed in the column direction under dummy word line DWL, similarly to the layout in FIG. 10. Accordingly, field region 200 is continuously formed for the memory cells in the same column.

In the region between the neighboring word lines, bit line contact 160 is arranged corresponding to each bit line. Storage node contact 170 is located in the region between dummy word line DWL and word line WL (generally representing word line(s) WL0–WL5), and is arranged corresponding to each DRAM cell 100. More specifically, storage node contact 170 is opposed to dummy word line DWL.

In the layout shown in FIG. 12, the basic cell region, in which DRAM cell 100 is formed, occupies an area of 6·$F^2$. In the layout shown in FIG. 12, field regions 200 are arranged in a striped pattern, but the field regions in each column form a zigzag pattern. The layout in FIG. 12 differs only in this zigzag pattern from that of the first modification (FIG. 10) of the third embodiment, in which field regions 200 in the striped pattern are inclined uniformly to have upper right ends.

In the layout according to the second modification of the third embodiment, field region 200 has a continuous form continued by the field regions formed under the respective dummy word lines DWL, and a thick isolating and insulating film for field isolation is not required.

Each dummy word line DWL is supplied with a ground voltage GND or a negative voltage lower than ground voltage GND, as is done in the first modification of the third embodiment. Thereby, the field region under each dummy word line DWL forms a field isolating region, which functions similarly to isolating and insulating film 220 in FIG. 9.

Accordingly, it is not necessary to provide an isolating and insulating film for field isolation, and field region 200 can be formed continuously. In addition to the effect of the third embodiment, therefore, such an effect can be achieved that the patterning for the field region can be easy, similarly to the first modification of the third embodiment.

In the first to third embodiments and the modifications of the third embodiment already described, the isolated cell plate is arranged corresponding to each twin-cell unit. However, the isolated cell plate may be provided for a predetermined section or range including a plurality of twin-cell units. This can likewise improve the refresh characteristics and the manufacturing yield.

Figure 13:
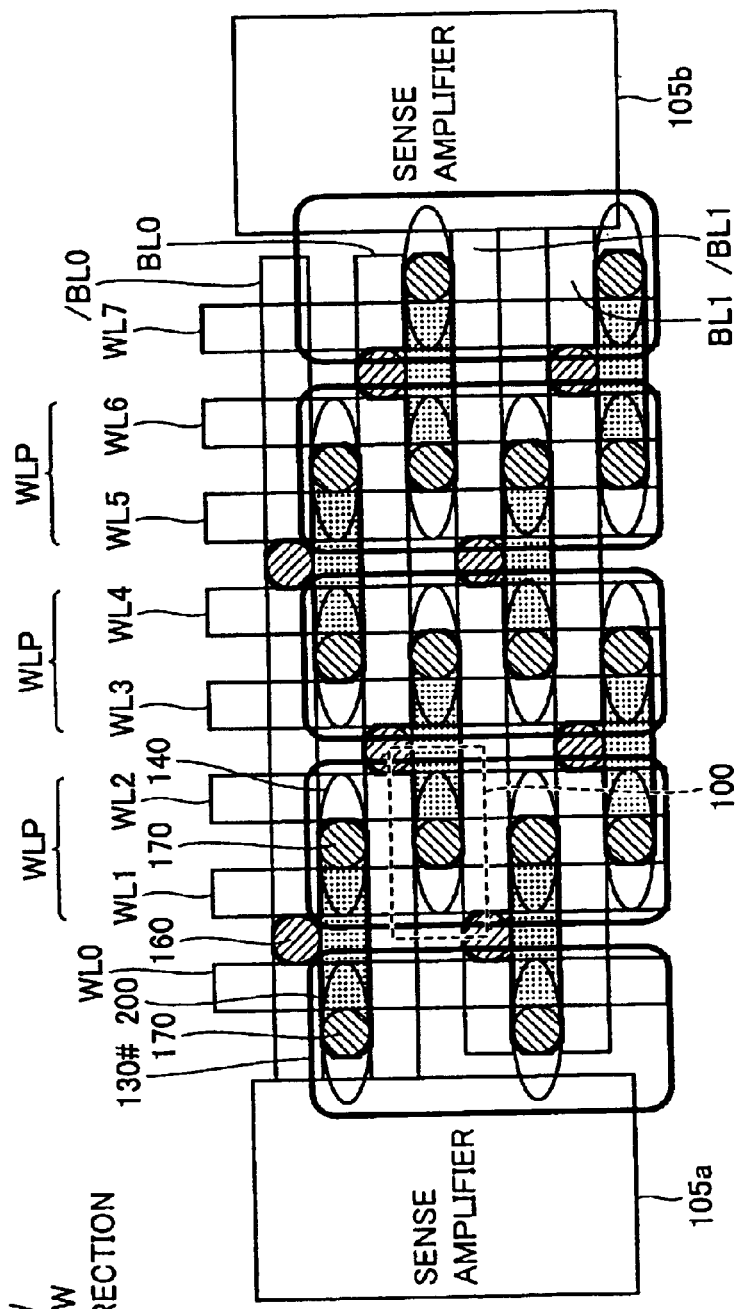
FIG. 13 schematically shows an example of a layout of a structure including isolated cell plates each provided for a plurality of twin-cell units.

For example, as shown in FIG. 13, isolated cell plate 130# may be arranged for each memory cell row in the layout according to the first embodiment shown in FIG. 2. In this case, each isolated cell plate 130# can be shared by a plurality of (two in FIG. 13) twin-cell units belonging to the same memory cell row. For this arrangement, however, it is essential that the voltages on the storage nodes storing the complementary data in each twin-cell unit vary within a similar range owing to the capacitive coupling. These voltage variations are caused by suppressing the capacitance of each isolated cell plate. Therefore, the effect of the invention is remarkably achieved by isolating the cell plate for each twin-cell unit.

Fourth Embodiment

A fourth embodiment will now be described in connection with a structure of a twin-cell unit further improving refresh characteristics.

Figure 14:
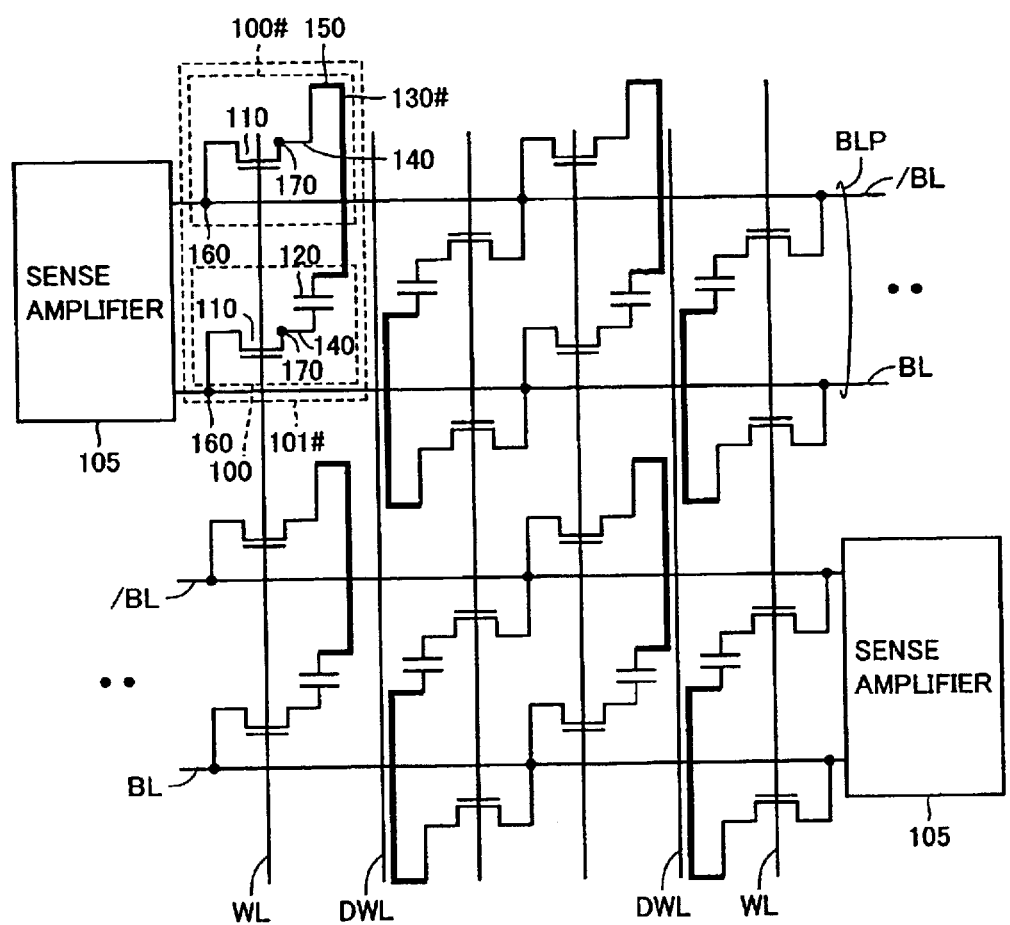
FIG. 14 schematically shows a structure of a memory array portion of a semiconductor memory device according to a fourth embodiment of the invention.

FIG. 14 schematically shows a structure of a memory array portion of a semiconductor memory device according to the fourth embodiment of the invention.

Referring to FIG. 14, each twin-cell unit 101# in the structure according to the fourth embodiment is formed of DRAM cell 100 and a DRAM cell 100# having the same structure as DRAM cell 100 except for that capacitor 120 is not arranged.

In the structure shown in FIG. 14, two DRAM cells 100 and 100# forming the same twin-cell unit 101# are connected to paired complementary bit lines BL and /BL, respectively, as is done in the first to third embodiments. Isolated cell plate 130# is provided corresponding to each twin-cell unit, and is isolated from the others, as is done in the structure shown in FIG. 1.

Similarly to the structure according to the third embodiment shown in FIG. 7, the gates of access transistors 110 in each twin-cell unit 101# are connected to the same word line WL, and dummy word lines DWL are arranged at predetermined intervals in addition to word line WL. Structures other than the above are substantially the same as those of the third embodiment shown in FIG. 7. Corresponding portions bear the same reference numbers, and description thereof is not repeated.

Figure 15:
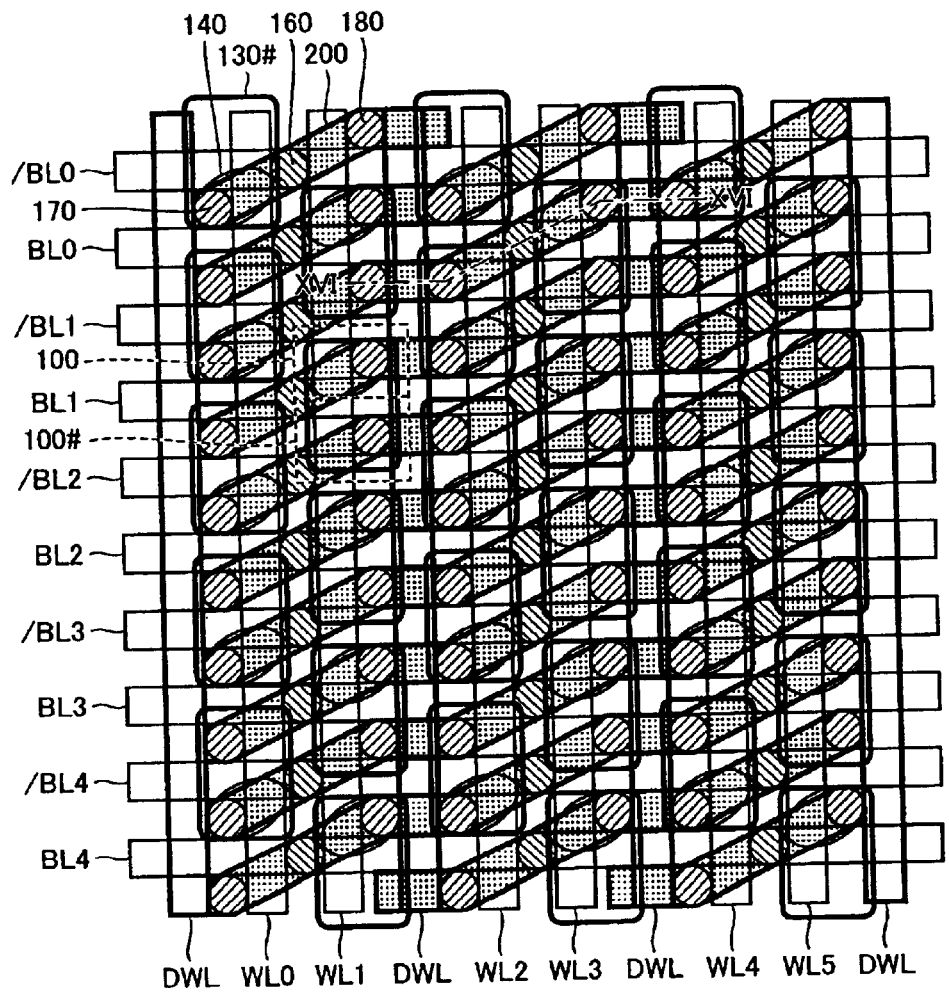
FIG. 15 schematically shows a layout of the memory array portion of the semiconductor memory device according to the fourth embodiment.

FIG. 15 schematically shows a layout of a memory array portion of the semiconductor memory device according to the fourth embodiment. FIG. 15 shows a layout, in which twin-cell units 101# according to the fourth embodiment are arranged similarly to the first modification of the third embodiment shown in FIG. 10.

In the fourth embodiment shown in FIG. 15, only one of the two DRAM cells forming the twin-cell unit is provided with storage node 140. As shown in FIG. 15, storage nodes 140 in each memory cell row are arranged corresponding to alternate columns, respectively, and two DRAM cells neighboring to each other in the row direction form the twin-cell unit. In this manner, each twin-cell unit is formed of DRAM cells 100 and 100#.

Each storage node 140 is electrically connected to corresponding field region 200 via storage node contact 170. A cell plate contact 180 is provided in the field region of the other cell forming the twin-cell unit. Each cell plate contact 180 electrically connects corresponding field region 200 and corresponding isolated cell plate 130# without interposing a capacitor therebetween.

The layout of the other portions including the isolated cell plate is substantially the same as that of the structure according to the first modification of the third embodiment shown in FIG. 10. Therefore, corresponding portions bear the same reference numbers, and description thereof is not repeated.

Figure 16:
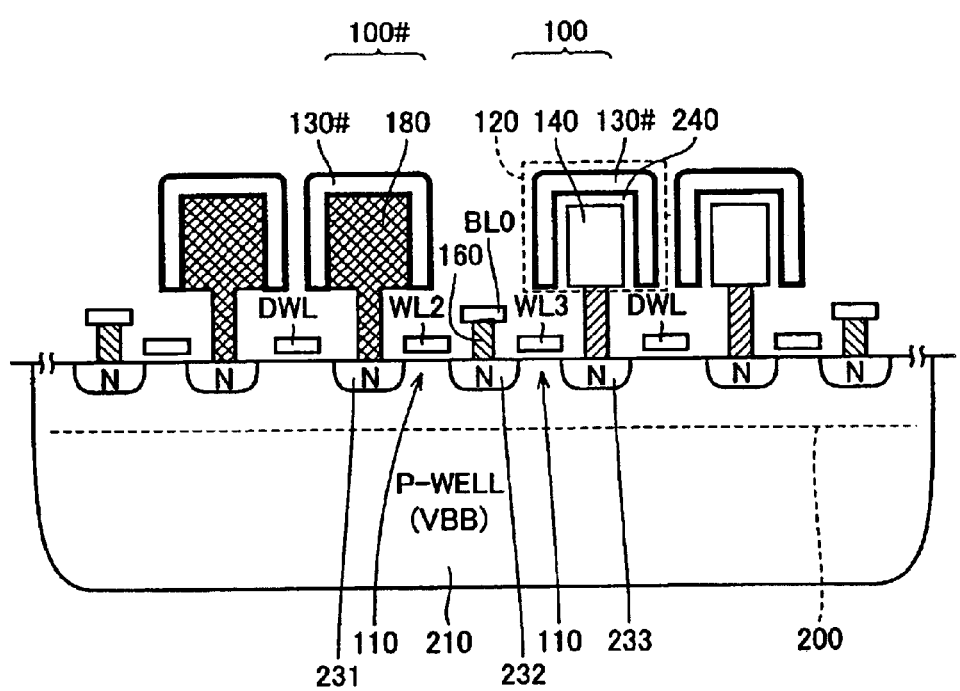
FIG. 16 is a cross section showing structures of memory cells in the semiconductor memory device according to the fourth embodiment shown in FIG. 15.

FIG. 16 is a cross section taken along line XVI—XVI in FIG. 15.

Referring to FIG. 16, the same structure as that already described is employed in one (100) of the two DRAM cells formed in the same field region 200 with bit line contact 160 therebetween. Thus, DRAM cell 100 has access transistor 110 formed of impurity regions 232 and 233, storage node 140, and capacitor 120 using a gap 240 between isolated cell plate 130# and storage node 140.

In contrast to the above, the other DRAM cell 100# has access transistor 110 formed of impurity regions 231 and 232, but impurity region 231 thereof is electrically connected to isolated cell plate 130# via cell plate contact 180 so that a capacitor is not formed between isolated cell plate 130# and access transistor 110. Impurity region 232 is shared by two DRAM cells 100 and 100#, and is electrically connected to corresponding bit line BL0 via common bit line contact 160.

Arrangements of dummy word lines DWL, isolated cell plates 130# and others are substantially the same as those in FIG. 11, and therefore, description thereof is not repeated. In FIG. 16, cell plate contact 180 in DRAM cell 100# has a form similar to those of storage node 140 and storage node contact 170. This structure can ensure the continuity of the forms in DRAM cells 100 and 100#, and thus can improve dimensional accuracies during manufacturing.

Since the twin-cell unit according to the fourth embodiment is provided with the isolated cell plate isolated from those in the other twin-cell units, the refresh characteristics and the manufacturing yield can be improved, similarly to the first to third embodiments. According to the structure of the fourth embodiment, since only one of the DRAM cells forming the same twin-cell unit is provided with the storage node (capacitor), the following effect can be further achieved.

In the first to third embodiments, since two capacitors each having a capacity value of Cs are connected in series to the storage node, as already described, the charge holding capacity for the storage node is equal to Cs/2. In the twin-cell unit according to the fourth embodiment, however, the charge holding value for the storage node is equal to the capacity value of one capacitor equal to Cs, and thus is larger than those in the first to third embodiments.

Instead of the example of the structure in FIG. 16, cell plate contact 180 may be configured to have the minimum sizes required for ensuring the electrical connection. Thereby, the layout may be designed to increase the capacity value of capacitor 120 by using a space produced by this size reduction. This layout can further increase the charge holding capacity for the storage node.

In the operation waveform diagram illustrated in FIG. 4, therefore, the twin-cell unit according to the fourth embodiment can improve the lowering rate of higher storage node voltage VRH to be equal to or lower than the lowering rate of higher storage node voltage VR2 in the conventional twin-cell unit. Accordingly, the fourth embodiment can further increase the refresh time, and thus, can further improve the refresh characteristics.

In the example shown in FIGS. 15 and 16, the twin-cell units according to the fourth embodiment are arranged to provide the layout similar to that in the first modification of the third embodiment. However, the layout of the twin-cell units according to the fourth embodiment is not restricted to the above, and the fourth embodiment may employ any one of the layouts in the first embodiment (FIG. 2), second embodiment (FIG. 6), third embodiment (FIG. 8) and second modification of the third embodiment (FIG. 12).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns,
   said plurality of memory cells being divided into a plurality of storage units each formed of the two memory cells bearing complementary data;
   a plurality of bit lines forming pairs each including the two bit lines and arranged corresponding to the columns of said memory cells, respectively;
   a plurality of word lines arranged corresponding to the rows of said memory cells, respectively, and extending in a direction crossing said plurality of bit lines; and
   a plurality of cell plates provided corresponding to said storage units, respectively, and each isolated at least electrically from the others, wherein
   each of said plurality of memory cells includes:
   a select transistor connected between the corresponding bit line and a storage node, and being turned on or off in accordance with a voltage on the corresponding word line, and
   a capacitor connected between said storage node and the corresponding cell plate.

2. The semiconductor memory device according to claim 1, wherein
   gates of the select transistors in said two memory cells forming the same storage unit are connected to the word lines different from each other, respectively.

3. The semiconductor memory device according to claim 2, wherein
   each of said plurality of memory cells further includes an active region extending in an extending direction of the corresponding bit line and defining a formation region of said select transistor,
   said active region extends continuously through a portion between the two memory cells neighboring to each other in the extending direction of the corresponding bit line, and
   said semiconductor memory device further comprises:
   a bit line contact provided for each of sets each including the neighboring two memory cells, and electrically connecting the corresponding active region to the corresponding bit line.

4. The semiconductor memory device according to claim 1, wherein
   gates of the select transistors in said two memory cells forming the same storage unit are connected to the same word line.

5. The semiconductor memory device according to claim 1, wherein
   gates of the select transistors in said two memory cells forming the same storage unit are connected to the same word line,
   each of said plurality of memory cells further includes an active region extending in a direction intermediate between an extending direction of the corresponding word line and an extending direction of the corresponding bit line, and defining a formation region of said select transistor,
   said semiconductor memory device further comprises:
   a plurality of bit line contacts connecting the active regions of said plurality of memory cells to the corresponding bit lines, respectively,
   said plurality of bit line contacts are aligned in the extending direction of said plurality of word lines, and are provided corresponding to said bit lines, respectively,
   the two word lines are arranged between said bit line contacts neighboring to each other in the extending direction of said plurality of bit lines,
   said active regions continuously extend through a portion between portions each including the two memory cells and neighboring to each other in the extending direction of said active region, and
   said bit line contact is shared by the neighboring two memory cells.

6. The semiconductor memory device according to claim 5, further comprising:
   a plurality of dummy word lines each arranged in a region between said storage nodes of the memory cells which correspond to the different bit line contacts and neighbor to each other in the extending direction of said plurality of bit lines, respectively, and extending in the same direction as said plurality of word lines.

7. The semiconductor memory device according to claim 6, wherein
   each of said plurality of dummy word lines carries a voltage at a predetermined level, and
   said active region continuously extends through a region under each of said dummy word lines.

8. The semiconductor memory device according to claim 7, wherein
   each of said plurality of dummy word lines carries a voltage at a predetermined level, and
   said active regions substantially extend continuously in the same direction such that said active regions in the memory cells arranged in the neighboring columns, respectively, and belonging to the neighboring rows, respectively, continue to each other.

9. The semiconductor memory device according to claim 7, wherein
   each of said plurality of dummy word lines carries a voltage at a predetermined level, and said active regions are continuously formed to be symmetric with respect to each of said dummy word lines.

10. The semiconductor memory device according to claim 6, wherein
each of said plurality of dummy word lines carries a voltage at a predetermined level.

11. The semiconductor memory device according to claim 6, wherein
an interval between said word line and said dummy word line is substantially equal to an interval between said word lines.

12. The semiconductor memory device according to claim 1, wherein
each of said storage units stores one bit data with the two memory cells bearing complementary data, and
each of said cell plates is electrically floated.

13. A semiconductor memory device comprising:
a plurality of memory cells arranged in rows and columns,
said plurality of memory cells being divided into a plurality of storage units each formed of the two memory cells bearing complementary data;
a plurality of bit lines forming pairs each including the two bit lines and arranged corresponding to the columns of said memory cells, respectively;
a plurality of word lines arranged corresponding to the rows of said memory cells, respectively, and extending in a direction crossing said plurality of bit lines; and
a plurality of cell plates provided corresponding to predetermined sections of said plurality of storage units, respectively, and each isolated at least electrically from the others, wherein
each of said plurality of memory cells includes:
a select transistor connected between the corresponding bit line and a storage node, and being turned on or off in accordance with a voltage on the corresponding word line, and
a capacitor connected between said storage node and the corresponding cell plate.

14. A semiconductor memory device comprising:
a plurality of memory cells arranged in rows and columns,
said plurality of memory cells being divided into a plurality of storage units each formed of the two memory cells bearing complementary data;
a plurality of bit lines forming pairs each including the two bit lines and arranged corresponding to the columns of said memory cells, respectively;
a plurality of word lines arranged corresponding to the rows of said memory cells, respectively, and extending in a direction crossing said plurality of bit lines; and
a plurality of cell plates provided corresponding to said storage units, respectively, and each isolated at least electrically from the others, wherein
one of said two memory cells forming each of said storage units includes:
a select transistor connected between one of said paired two bit lines and a storage node, and being turned on or off in accordance with a voltage on the corresponding word line, and
a capacitor connected between said storage node and the corresponding cell plate; and
the other of said two memory cells forming said storage unit includes:
a select transistor connected between the other of said paired two bit lines and said cell plate without interposing a capacitor, and being turned on or off in accordance with the voltage on the corresponding word line.

15. The semiconductor memory device according to claim 13, wherein
each of said storage units stores one bit data with the two memory cells bearing complementary data, and
each of said cell plates is electrically floated.

16. The semiconductor memory device according to claim 14, wherein
each of said storage units stores one bit data with the two memory cells bearing complementary data, and
each of said cell plates is electrically floated.

* * * * *